(12) United States Patent
Taniguchi et al.

(10) Patent No.: US 12,425,003 B2
(45) Date of Patent: Sep. 23, 2025

(54) ACOUSTIC WAVE DEVICE

(71) Applicant: Murata Manufacturing Co., Ltd., Nagaokakyo (JP)

(72) Inventors: Yasumasa Taniguchi, Nagaokakyo (JP); Katsuya Daimon, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 393 days.

(21) Appl. No.: 17/969,727

(22) Filed: Oct. 20, 2022

(65) Prior Publication Data

US 2023/0041470 A1     Feb. 9, 2023

Related U.S. Application Data

(63) Continuation of application No. PCT/JP2021/016510, filed on Apr. 23, 2021.

(30) Foreign Application Priority Data

Apr. 27, 2020    (JP) ................................ 2020-078145

(51) Int. Cl.
    *H03H 9/25*       (2006.01)
    *H03H 9/02*       (2006.01)
    (Continued)

(52) U.S. Cl.
    CPC .......... *H03H 9/25* (2013.01); *H03H 9/02007* (2013.01); *H03H 9/02842* (2013.01);
    (Continued)

(58) Field of Classification Search
    CPC ............. H03H 9/02; H03H 9/145; H03H 9/25
    See application file for complete search history.

(56) References Cited

U.S. PATENT DOCUMENTS 9,431,996 B2 *   8/2016   Watanabe .............. H10N 30/01
9,780,759 B2 *   10/2017   Kimura ............. H03H 9/02228
(Continued)

FOREIGN PATENT DOCUMENTS

CN      109698681 A     4/2019
CN      109802650 A     5/2019
(Continued)

OTHER PUBLICATIONS

International Search Report in PCT/JP2021/016510, mailed Jun. 8, 2021, 3 pages.
(Continued)

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave device includes an IDT electrode and reflector electrodes on or above a piezoelectric substrate. A region in which first and second electrode fingers of the IDT electrode overlap each other in an acoustic wave propagation direction defines an intersection region. The intersection region includes a center region and first and second edge regions on both sides of the center region. Dielectric films extend from the first and second edge regions to outer side regions in the acoustic wave propagation direction of the reflector electrodes via the reflector electrodes.

20 Claims, 5 Drawing Sheets

(51) Int. Cl.
  *H03H 9/13*  (2006.01)
  *H03H 9/145*  (2006.01)

(52) U.S. Cl.
  CPC ........ *H03H 9/02992* (2013.01); *H03H 9/131* (2013.01); *H03H 9/145* (2013.01)

(56) References Cited

U.S. PATENT DOCUMENTS

| | | | |
|---|---|---|---|
| 11,824,518 B2* | 11/2023 | Takigawa | H03H 9/1457 |
| 11,848,658 B2* | 12/2023 | Hiramatsu | H03H 9/14541 |
| 11,990,891 B2* | 5/2024 | Weng | H03H 9/02834 |
| 2013/0249647 A1 | 9/2013 | Nakanishi et al. | |
| 2017/0155373 A1 | 6/2017 | Ruby et al. | |
| 2019/0123713 A1* | 4/2019 | Daimon | H03H 9/1457 |
| 2019/0140614 A1 | 5/2019 | Okada | |
| 2019/0149128 A1 | 5/2019 | Saji et al. | |
| 2019/0158059 A1 | 5/2019 | Taniguchi | |
| 2019/0305747 A1 | 10/2019 | Takigawa | |
| 2019/0334499 A1 | 10/2019 | Koyanagi et al. | |
| 2021/0351760 A1 | 11/2021 | Takigawa | |
| 2023/0039830 A1* | 2/2023 | Daimon | H03H 9/25 |

FOREIGN PATENT DOCUMENTS

| | | |
|---|---|---|
| JP | 2016184951 A | 10/2016 |
| KR | 20190018525 A | 2/2019 |
| KR | 20190077551 A | 7/2019 |
| WO | 2017187724 A1 | 11/2017 |
| WO | 2018057956 A1 | 3/2018 |
| WO | 2018123882 A1 | 7/2018 |
| WO | 2019004205 A1 | 1/2019 |
| WO | 2020171050 A1 | 8/2020 |

OTHER PUBLICATIONS

Written Opinion in PCT/JP2021/016510, mailed Jun. 8, 2021, 5 pages.
Official Communication issued in corresponding Chinese Patent Application No. 202180028743.8, mailed on May 16, 2025, 7 pages.

* cited by examiner

ACOUSTIC WAVE DEVICE

CROSS REFERENCE TO RELATED APPLICATIONS

This application claims the benefit of priority to Japanese Patent Application No. 2020-078145 filed on Apr. 27, 2020 and is a Continuation Application of PCT Application No. PCT/JP2021/016510 filed on Apr. 23, 2021. The entire contents of each application are hereby incorporated herein by reference.

BACKGROUND OF THE INVENTION

1. Field of the Invention

The present invention relates to an acoustic wave device including an interdigital transducer (IDT) electrode and reflector electrodes.

2. Description of the Related Art

In an acoustic wave device described in US 2017/0155373 A1, a piezoelectric film is stacked on a support substrate. An IDT electrode and reflector electrodes disposed on both sides of the IDT electrode in an acoustic wave propagation direction are provided over the piezoelectric film. In US 2017/0155373 A1, an intersection region of the IDT electrode includes a center region and first and second edge regions disposed on outer sides of the center region in a direction in which electrode fingers extend. In the first and second edge regions, a dielectric film is provided between the electrode fingers and the piezoelectric film.

In the acoustic wave device described in US 2017/0155373 A1, acoustic discontinuity between the IDT electrode and the reflector electrodes is large. Thus, there is a problem that energy scattering occurs and a loss increases.

SUMMARY OF THE INVENTION

Preferred embodiments of the present invention provide acoustic wave devices each having a small loss.

An acoustic wave device according to a preferred embodiment of the present invention includes a piezoelectric substrate, an interdigital (IDT) electrode on or above the piezoelectric substrate and including first and second electrode fingers interdigitated with each other, and reflector electrodes on both sides of the IDT electrode in an acoustic wave propagation direction and including a plurality of electrode fingers. In the IDT electrode, a region in which the first electrode finger and the second electrode finger overlap each other when viewed in the acoustic wave propagation direction is an intersection region, the intersection region includes a center region and first and second edge regions on both sides of the center region in a direction in which the first and second electrode fingers extend, and the acoustic wave device further includes a dielectric film extending from the first and second edge regions to regions on outer sides in the acoustic wave propagation direction of regions in which the reflector electrodes are provided.

According to preferred embodiments of the present invention, acoustic wave devices each having a small loss are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be described below with reference to the drawings by describing preferred embodiments of the present invention.

Each preferred embodiment described in the present specification is an example, and partial replacement or combination of configurations is possible between different preferred embodiments.

Figure 1:
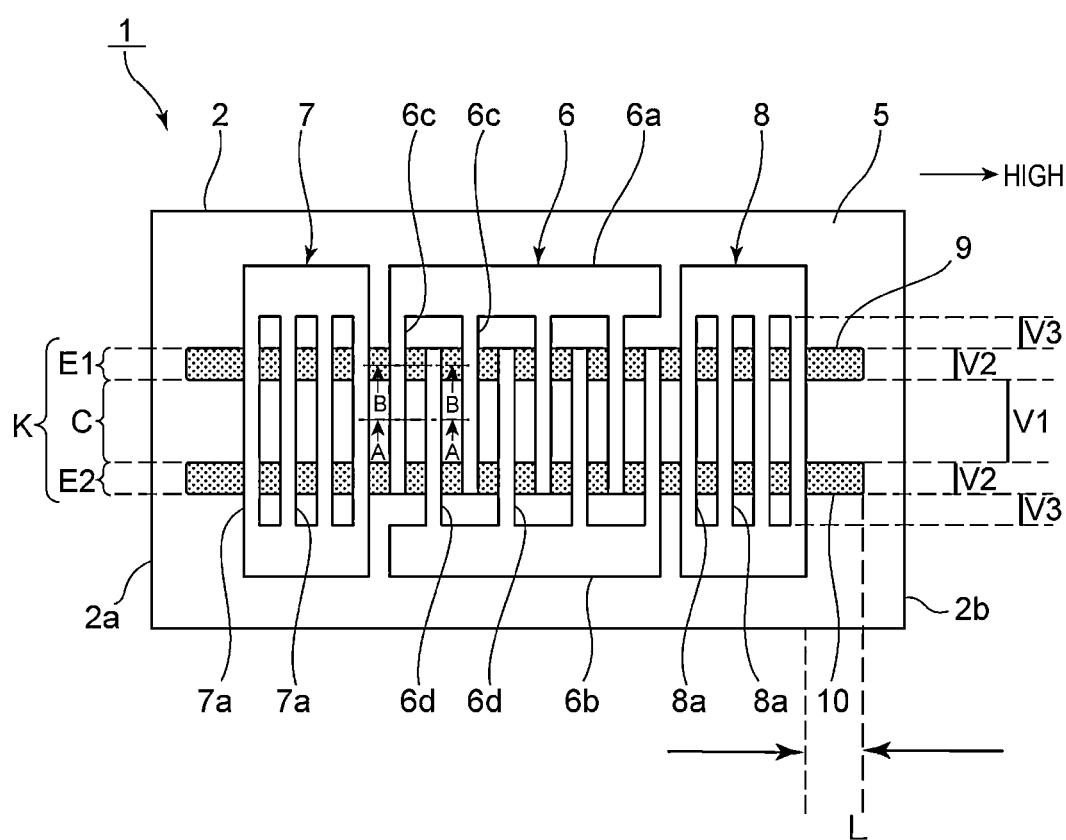
FIG. 1 is a plan view of an acoustic wave device according to a first preferred embodiment of the present invention.
Figure 2A:
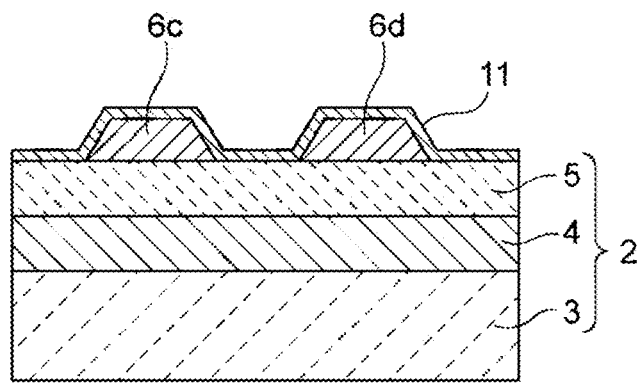
FIGS. 2A and 2B are sectional views taken along line A-A and line B-B in FIG. 1, respectively.
Figure 2B:
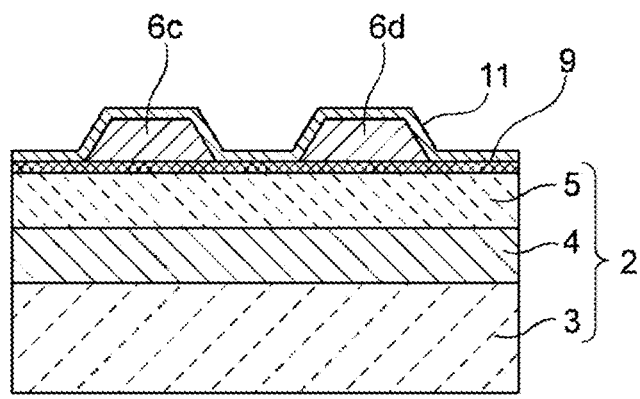

FIG. 1 is a plan view of an acoustic wave device according to a first preferred embodiment of the present invention. FIGS. 2A and 2B are sectional views taken along line A-A and line B-B in FIG. 1.

An acoustic wave device 1 includes a piezoelectric substrate 2. The piezoelectric substrate 2 includes a support substrate 3 made of, for example, Si, a low acoustic velocity film 4 stacked on the support substrate 3 and made of, for example, silicon oxide as a low acoustic velocity material, and a piezoelectric film 5 stacked on the low acoustic velocity film 4.

The low acoustic velocity material refers to a material in which the acoustic velocity of a bulk wave propagating therethrough is lower than the acoustic velocity of a bulk wave propagating through the piezoelectric film 5. Examples of such a low acoustic velocity material include silicon oxide. However, the material of the low acoustic velocity film 4 is not limited to silicon oxide. The material of the low acoustic velocity film 4 may be, for example, silicon oxide, glass, silicon oxynitride, tantalum oxide, a compound obtained by adding fluorine, carbon, or boron to silicon oxide, or a material including any of the above-described materials as a main component.

In the present preferred embodiment, the support substrate 3 is made of, for example, Si as a high acoustic velocity material. The high acoustic velocity material refers to a material that the acoustic velocity of a bulk wave propagating therethrough is higher than the acoustic velocity of an acoustic wave propagating through the piezoelectric film 5. As the high acoustic velocity material, alternatively to Si, for example, aluminum oxide, silicon carbide, sapphire, lithium tantalate, lithium niobate, quartz crystal, alumina, zirconia, cordierite, mullite, steatite, forsterite, magnesia, a DLC (diamond-like carbon) film, diamond, a material including the above-described material as a main component, or the like can be used.

The piezoelectric film 5 is made of, for example, lithium tantalate. However, the piezoelectric film 5 may be made of another piezoelectric body such as, for example, lithium niobate.

Since the piezoelectric substrate 2 has the above-described multilayer structure, the acoustic wave excited in the piezoelectric film 5 can be effectively confined in the piezoelectric film 5. An IDT electrode 6 and first and second reflector electrodes 7 and 8 provided on both sides of the IDT electrode 6 in an acoustic wave propagation direction are provided on or above the piezoelectric substrate 2.

The IDT electrode 6 and the first and second reflector electrodes 7 and 8 are made of an appropriate metal of, for example, Al, Cu, Mo, or W, or an alloy including such a metal.

The IDT electrode 6 includes a first busbar 6a and a second busbar 6b facing each other. One end of each of a plurality of first electrode fingers 6c is connected to the first busbar 6a. One end of each of a plurality of second electrode fingers 6d is connected to the second busbar 6b. The plurality of first electrode fingers 6c are interdigitated with the plurality of second electrode fingers 6d.

The first reflector electrode 7 includes a plurality of electrode fingers 7a. Both ends of the plurality of electrode fingers 7a are short-circuited. The second reflector electrode 8 similarly includes a plurality of electrode fingers 8a. Both ends of the plurality of electrode fingers 8a are short-circuited.

In the acoustic wave device 1, the IDT electrode 6 and first and second reflector electrodes 7 and 8 define a one-port acoustic wave resonator. An acoustic wave is excited by applying an AC voltage between the first electrode fingers 6c and the second electrode fingers 6d. In the present preferred embodiment, the piezoelectric film 5 is made of, for example, $LiTaO_3$, and a SH (Shear Horizontal) wave is excited as a main mode.

In the acoustic wave device 1, the acoustic wave propagation direction is a direction orthogonal or substantially orthogonal to a direction in which the first and second electrode fingers 6c and 6d extend. When viewed in the acoustic wave propagation direction, a region where the first electrode fingers 6c overlap the second electrode fingers 6d is an intersection region K as a resonance region. The intersection region K includes a center region C and first and second edge regions E1 and E2 provided on both sides of the center region C in the direction in which the first and second electrode fingers 6c and 6d extend.

In the acoustic wave device 1, dielectric films 9 and 10 are provided in the first edge region E1 and the second edge region E2. The dielectric films 9 and 10 add masses in the first and second edge regions E1 and E2. A dielectric selected from the group consisting of, for example, tantalum oxide, hafnium oxide, tungsten oxide, selenium oxide, and niobium oxide is preferably used as the dielectric as the material of the dielectric films. In the present preferred embodiment, for example, $Ta_2O_5$ is used as tantalum oxide.

As illustrated in FIG. 2A, in the center region C, there is no dielectric film between the first and second electrode fingers 6c and 6d, and the piezoelectric substrate 2. In contrast, as illustrated in FIG. 2B, in the first edge region E1, the dielectric film 9 is provided between the first and second electrode fingers 6c and 6d, that is, the IDT electrode 6, and the piezoelectric substrate 2. Further, the dielectric film 9 is also located below the first and second reflector electrodes 7 and 8. That is, the dielectric film 9 extends from between the IDT electrode 6 and the piezoelectric substrate 2 to between the reflector electrodes 7 and 8 and the piezoelectric substrate 2. Similarly, in the second edge region E2, the dielectric film 10 is provided between the first and second electrode fingers 6c and 6d, that is, the IDT electrode 6, and the piezoelectric substrate 2. Further, the dielectric film 10 is also located below the first and second reflector electrodes 7 and 8.

Since the dielectric films 9 and 10 are provided, the acoustic velocity in the first and second edge regions E1 and E2 is decreased compared to the acoustic velocity in the center region C. FIG. 1 illustrates the relationship among an acoustic velocity V1 in the center region C, an acoustic velocity V2 in the first and second edge regions E1 and E2, and an acoustic velocity V3 in gap regions on outer sides of the first and second edge regions E1 and E2 in the direction in which the electrode fingers extend. That is, on the right side of the acoustic wave device 1 in FIG. 1, a scale in which the acoustic velocity increases toward the right side is indicated. The relationship of V3>V1>V2 is satisfied.

Thus, with the acoustic wave device 1, it is possible to reduce or prevent a ripple of a transverse mode due to the difference in acoustic velocity.

In the acoustic wave device 1, in the first and second edge regions E1 and E2, the dielectric films 9 and 10 are not only located below the IDT electrode 6 but also extend from below the IDT electrode 6 beyond below the first and second reflector electrodes 7 and 8 to regions on the outer sides in the acoustic wave propagation direction. Thus, a reduction in loss is obtained in the acoustic wave device 1. This will be described in more detail.

As described in US 2017/0155373 A1, by decreasing the acoustic velocity in the first and second edge regions E1 and E2 and defining a piston mode resonator, it is possible to reduce or prevent a ripple of a transverse mode. However, in the acoustic wave device of US 2017/0155373 A1, there is a problem in that acoustic discontinuity between the IDT electrode and the reflector electrodes increases. More specifically, in the edge regions, acoustic discontinuity between the IDT electrode and the reflector electrodes, that is, a difference in acoustic velocity or a difference in reflection coefficient may increase. Thus, there is a problem in that scattering of an acoustic wave is likely to occur and a loss due to the scattering increases.

In contrast, in the acoustic wave device 1, the dielectric films 9 and 10 extend from the IDT electrode 6 to the regions on the outer sides of the first and second reflector electrodes 7 and 8 via below the first and second reflector electrodes 7 and 8. Thus, acoustic discontinuity in the first and second edge regions E1 and E2 is decreased. Accordingly, scattering of an acoustic wave is less likely to occur, and thus a loss due to the scattering can be reduced or prevented. Therefore, it is possible to provide the acoustic wave device 1 with a small loss.

In the acoustic wave device 1, the dielectric films 9 and 10 are provided so as not to reach edges 2a and 2b located on both sides of the piezoelectric substrate 2 in the acoustic wave propagation direction. Accordingly, when a reliability test such as a reflow test or a thermal shock test is performed, even if a tensile stress is generated by the dielectric films 9 and 10, it is possible to obtain an advantageous effect that a crack is less likely to be generated at the edges 2a and 2b of the piezoelectric substrate 2, which is preferable.

Although a protective film provided in the uppermost layer is not illustrated in FIG. 1, as illustrated in FIGS. 2A and 2B, in the acoustic wave device 1, a protective film 11 covers the IDT electrode 6 and covers the first and second reflector electrodes 7 and 8 not illustrated in FIGS. 2A and 2B. The protective film 11 is made of, for example, silicon oxide. However, the protective film 11 can be made of another dielectric other than silicon oxide, for example, any of various materials, such as silicon oxynitride and silicon nitride.

Figure 3:
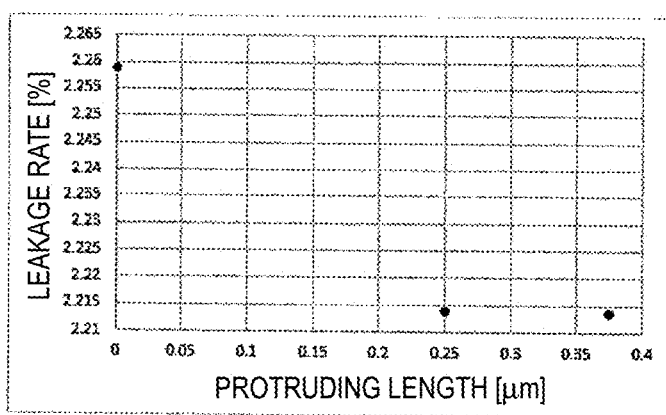
FIG. 3 is a graph showing the relationship between the protruding length of a dielectric film protruding from an outer edge of a reflector and the energy leakage rate in the acoustic wave device according to the first preferred embodiment of the present invention.

In the acoustic wave device 1, the dielectric films 9 and 10 extend further outward from the outer edges of the first and second reflector electrodes 7 and 8. The length of the outwardly extending portions is referred to as a protruding length L. FIG. 3 is a graph showing the relationship between the protruding length L (μm) and the leakage rate of energy. The leakage rate of energy refers to a ratio of energy leaking to the outside to energy generated by excitation of the IDT electrode 6. The smaller the leakage rate, the smaller the energy loss. That is, the loss in the pass band can be reduced.

As is apparent from FIG. 3, the leakage rate of energy is smaller in a case where the protruding length is, for example, about 0.25 μm or about 0.375 μm as compared to a case where the protruding length is 0. Accordingly, as in the acoustic wave device 1, it is preferable that the dielectric films 9 and 10 extend outward beyond the outer edges of the first and second reflector electrodes 7 and 8.

Figure 4:
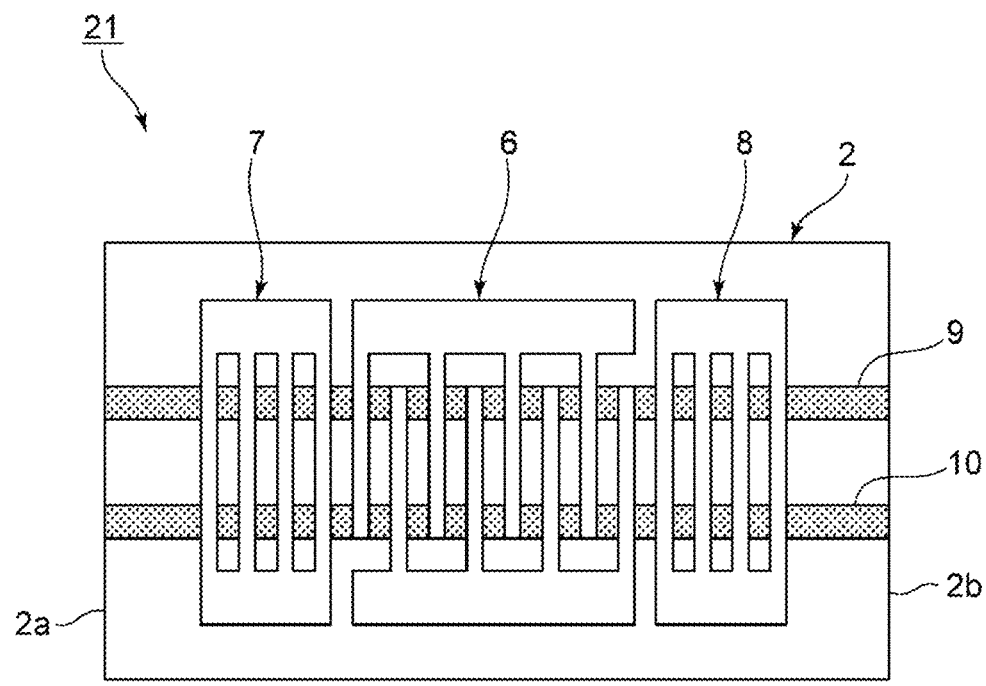
FIG. 4 is a plan view of an acoustic wave device according to a second preferred embodiment of the present invention.

FIG. 4 is a plan view of an acoustic wave device according to a second preferred embodiment of the present invention. In an acoustic wave device 21, the dielectric films 9 and 10 extend to the edges 2a and 2b located on both sides of the piezoelectric substrate 2 in the acoustic wave propagation direction. Other configurations of the acoustic wave device 21 are the same as or similar to those of the acoustic wave device 1. Accordingly, the same or corresponding portions are denoted by the same reference numerals, and the description thereof will be omitted.

In the acoustic wave device 21, since the dielectric films 9 and 10 are provided in the first and second edge regions E1 and E2, a piston mode can be obtained similarly to the acoustic wave device 1. Moreover, the dielectric films 9 and 10 extend beyond the first and second reflector electrodes 7 and 8 to reach the regions on the outer sides of the first and second reflector electrodes 7 and 8. Thus, similarly to the acoustic wave device 1, a reduction in loss can be obtained.

The dielectric films 9 and 10 extend to the edges 2a and 2b. In a preferred embodiment of the present invention, as described above, the dielectric films 9 and 10 may extend to the edges 2a and 2b.

Figure 5:
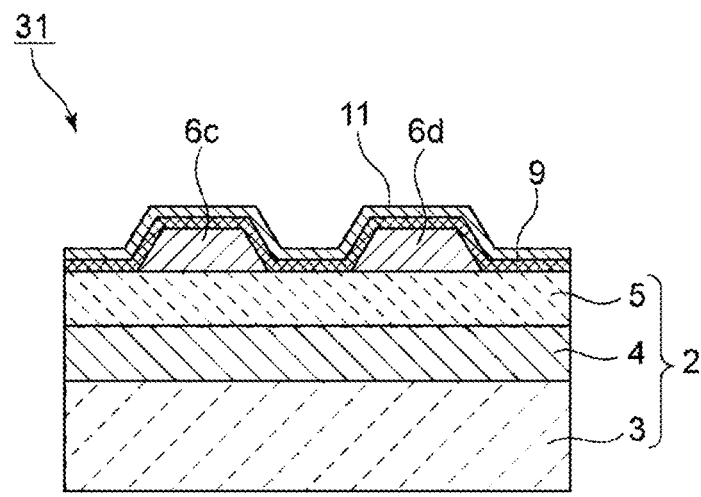
FIG. 5 is an elevational sectional view illustrating a main portion of an acoustic wave device according to a third preferred embodiment of the present invention.

FIG. 5 is an elevational sectional view illustrating a main portion of an acoustic wave device according to a third preferred embodiment of the present invention. In FIG. 5, a portion corresponding to FIG. 2B is illustrated. That is, the sectional structure in the first edge region is illustrated. In an acoustic wave device 31, the dielectric film 9 is provided in the first edge regions to cover the first and second electrode fingers 6c and 6d, that is, on an upper surface of the IDT electrode 6. As described above, in a preferred embodiment of the present invention, the dielectric film to decrease the acoustic velocity in the first and second edge regions may be provided to cover the electrode fingers of the IDT electrode and the reflector electrodes.

Figure 6:
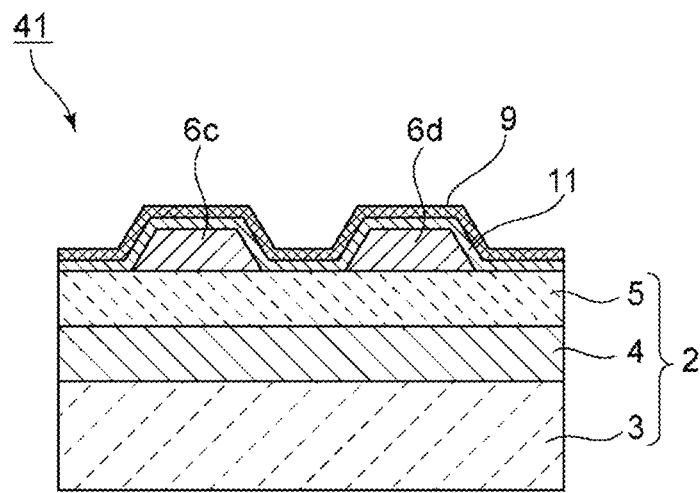
FIG. 6 is an elevational sectional view illustrating a main portion of an acoustic wave device according to a fourth preferred embodiment of the present invention.

FIG. 6 is an elevational sectional view illustrating a main portion of an acoustic wave device according to a fourth preferred embodiment of the present invention. FIG. 6 also illustrates the sectional structure illustrated in FIG. 2B, that is, in the first edge region. In an acoustic wave device 41, the dielectric film 9 is stacked on an upper surface of the protective film 11. As described above, the dielectric film 9 may cover the first and second electrode fingers 6c and 6d and the protective film 11 in the first edge region. In this case, the dielectric film is provided similarly in the second edge region.

Figure 7:
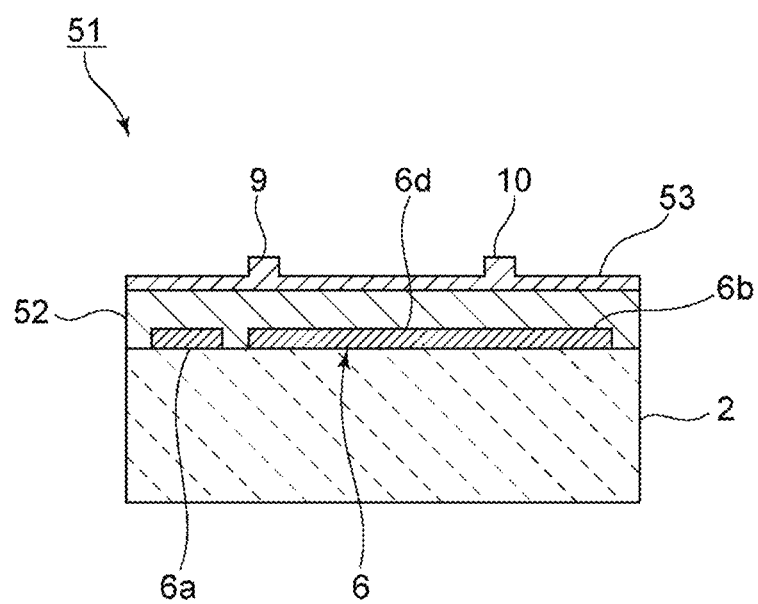
FIG. 7 is a side sectional view illustrating an acoustic wave device according to a fifth preferred embodiment of the present invention.

FIG. 7 is a side sectional view of an acoustic wave device according to a fifth preferred embodiment of the present invention. FIG. 7 illustrates a section of an acoustic wave device 51 extending in a direction orthogonal or substantially orthogonal to the acoustic wave propagation direction, that is, a section extending in a direction in which the second electrode fingers 6d of the IDT electrode 6 extend.

In the acoustic wave device 51, the IDT electrode 6 is provided on the piezoelectric substrate 2. In FIG. 7, the first busbar 6a, the second electrode finger 6d, and the second busbar 6b are illustrated.

In the acoustic wave device 51, a protective film 52 covers the IDT electrode 6. The protective film 52 is made of an appropriate insulator such as, for example, silicon oxide or silicon oxynitride.

The protective film 52 may be a frequency-temperature characteristics adjusting film to adjust the frequency-temperature characteristics.

A dielectric film 53 is further stacked on the protective film 52. In the dielectric film 53, portions projecting upward are provided in portions corresponding to the first and second edge regions E1 and E2. The projecting portions define the dielectric films 9 and 10 as mass adding films.

Consequently, masses are added to the portions corresponding to the first and second edge regions E1 and E2, and the acoustic velocity is lowered.

In the acoustic wave device 51, as in the first to fourth preferred embodiments, the dielectric films 9 and 10 extend beyond the first and second reflector electrodes and reach the regions on the outer sides of the first and second reflector electrodes in the acoustic wave propagation direction. Accordingly, similarly to the acoustic wave device 1, a reduction in loss can be obtained.

In the acoustic wave device 51, the piezoelectric substrate 2 is a single piezoelectric body. As such a piezoelectric body, a piezoelectric single crystal such as, for example, lithium tantalate or lithium niobate can be used. In a preferred embodiment of the present invention, as described above, the piezoelectric substrate 2 made of a single piezoelectric body may be used.

In the acoustic wave device 1, a multilayer body including the support substrate 3 made of, for example, Si, the low acoustic velocity film 4, and the piezoelectric film 5 is used as the piezoelectric substrate 2. However, a high acoustic velocity material layer made of a high acoustic velocity material may be provided between the support substrate 3 and the low acoustic velocity film 4. In this case, the support substrate 3 may be made of an insulating material or a semiconductor material other than the high acoustic velocity material. In the acoustic wave device 1, the support substrate 3 is made of, for example, Si and is integrated with the high acoustic velocity material layer.

Figure 8:
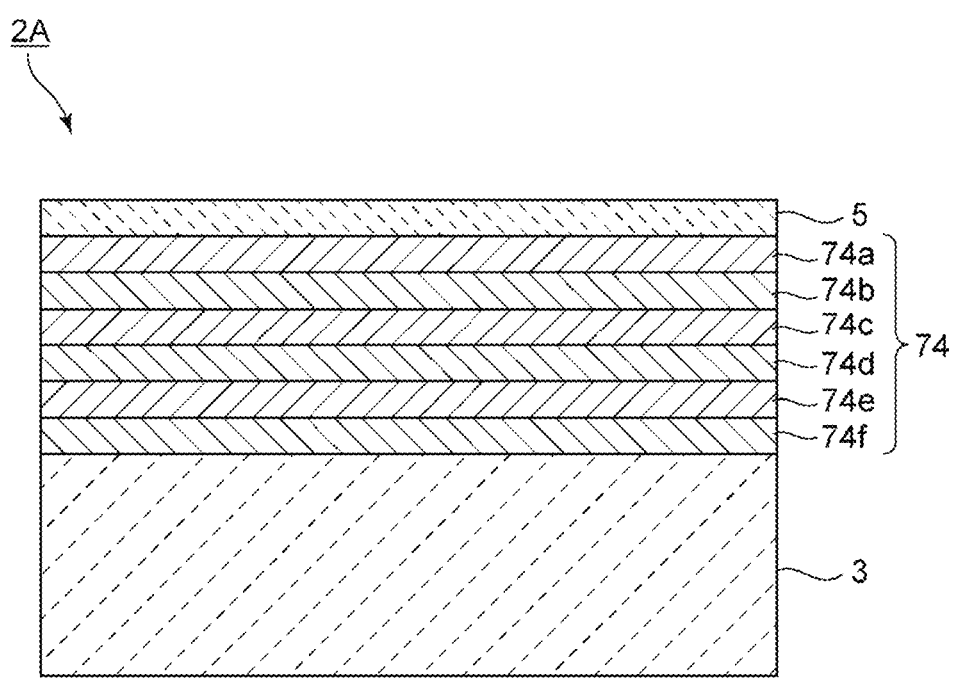
FIG. 8 is an elevational sectional view explaining a modification of a piezoelectric substrate according to a preferred embodiment of the present invention.

In a preferred embodiment of the present invention, a piezoelectric substrate 2A illustrated in FIG. 8 may be used. In the piezoelectric substrate 2A, an acoustic reflection film 74 is stacked between the support substrate 3 and the piezoelectric film 5. The acoustic reflection film 74 has a structure in which low acoustic impedance layers 74a, 74c, and 74e having a relatively low acoustic impedance and high acoustic impedance layers 74b, 74d, and 74f having a relatively high acoustic impedance are alternately stacked. The number of these stacked layers is not particularly limited. Even when the piezoelectric substrate 2A including such an acoustic reflection film 74 is used, it is possible to effectively confine energy of an acoustic wave in the piezoelectric film 5.

As a low acoustic impedance material of the low acoustic impedance layers 74a, 74c, and 74e and a high acoustic impedance material of the high acoustic impedance layers 74b, 74d, and 74f, a combination of appropriate materials satisfying the above-described acoustic impedance relationship can be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate;
an interdigital transducer (IDT) electrode on or above the piezoelectric substrate and including first and second electrode fingers interdigitated with each other;
reflector electrodes on both sides of the IDT electrode in an acoustic wave propagation direction and including a plurality of electrode fingers; wherein
in the IDT electrode, a region in which the first electrode finger and the second electrode finger overlap each other when viewed in the acoustic wave propagation direction defines an intersection region, the intersection region includes a center region and first and second edge regions on both sides of the center region in a direction in which the first and second electrode fingers extend;
the acoustic wave device further includes a dielectric film extending from the first and second edge regions to outer sides in the acoustic wave propagation direction of regions in which the reflector electrodes are provided; and
the dielectric film extends beyond outer edges of the reflector electrodes in the acoustic wave propagation direction by at least a length of about 0.25 μm.

2. The acoustic wave device according to claim 1, wherein the dielectric film does not extend to end portions of the piezoelectric substrate.

3. The acoustic wave device according to claim 2, wherein the dielectric film extends from between the IDT electrode and the piezoelectric substrate to between the reflector electrodes and the piezoelectric substrate.

4. The acoustic wave device according to claim 2, wherein the dielectric film extends from above the IDT electrode to above the reflector electrodes.

5. The acoustic wave device according to claim 2, further comprising a protective film covering the IDT electrode.

6. The acoustic wave device according to claim 1, wherein the dielectric film extends to end portions of the piezoelectric substrate.

7. The acoustic wave device according to claim 6, wherein the dielectric film extends from between the IDT electrode and the piezoelectric substrate to between the reflector electrodes and the piezoelectric substrate.

8. The acoustic wave device according to claim 6, wherein the dielectric film extends from above the IDT electrode to above the reflector electrodes.

9. The acoustic wave device according to claim 6, further comprising a protective film covering the IDT electrode.

10. The acoustic wave device according to claim 1, wherein the dielectric film extends from between the IDT electrode and the piezoelectric substrate to between the reflector electrodes and the piezoelectric substrate.

11. The acoustic wave device according to claim 1, wherein the dielectric film extends from above the IDT electrode to above the reflector electrodes.

12. The acoustic wave device according to claim 1, further comprising a protective film covering the IDT electrode.

13. The acoustic wave device according to claim 1, wherein the dielectric film is made of tantalum oxide, hafnium oxide, tungsten oxide, selenium oxide, or niobium oxide.

14. The acoustic wave device according to claim 1, wherein an acoustic velocity in the first and second edge regions is less than an acoustic velocity in the center region.

15. The acoustic wave device according to claim 1, wherein the piezoelectric substrate includes a support substrate and a piezoelectric film directly or indirectly on the support substrate.

16. The acoustic wave device according to claim 15, wherein the piezoelectric substrate further includes a high acoustic velocity material layer between the piezoelectric film and the support substrate and that is made of a high acoustic velocity material in which an acoustic velocity of a bulk wave propagating through the high acoustic velocity material is higher than an acoustic velocity of an acoustic wave propagating through the piezoelectric film.

17. The acoustic wave device according to claim 16, wherein the support substrate is made of the high acoustic velocity material, and the high acoustic velocity material layer and the support substrate are integrated.

18. The acoustic wave device according to claim 16, further comprising a low acoustic velocity film between the high acoustic velocity material layer and the piezoelectric film and that is made of a low acoustic velocity material in which an acoustic velocity of a bulk wave propagating through the low acoustic velocity material is lower than an acoustic velocity of a bulk wave propagating through the piezoelectric film.

19. The acoustic wave device according to claim 15, wherein the piezoelectric substrate further includes an acoustic reflection film between the piezoelectric film and the support substrate.

20. The acoustic wave device according to claim 19, wherein the acoustic reflection film includes a low acoustic impedance layer having a relatively low acoustic impedance and a high acoustic impedance layer having a relatively high acoustic impedance.

* * * * *